(12) United States Patent
Ode

(10) Patent No.: US 7,592,267 B2
(45) Date of Patent: Sep. 22, 2009

(54) METHOD FOR MANUFACTURING SEMICONDUCTOR SILICON SUBSTRATE AND APPARATUS FOR MANUFACTURING THE SAME

(75) Inventor: Hiroyuki Ode, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 182 days.

(21) Appl. No.: 11/600,105

(22) Filed: Nov. 16, 2006

(65) Prior Publication Data

US 2007/0120222 A1 May 31, 2007

(30) Foreign Application Priority Data

Nov. 25, 2005 (JP) ............................. 2005-340753

(51) Int. Cl.
*H01L 21/00* (2006.01)
(52) U.S. Cl. ...................... 438/762; 438/710; 438/778; 257/E21.174; 257/E21.224; 257/E21.228; 257/E21.252; 257/E21.585
(58) Field of Classification Search ................. 438/621, 438/762, 710; 257/E21.174, E21.224, E21.228, 257/E21.252, E21.255, E21.585
See application file for complete search history.

(56) References Cited

U.S. PATENT DOCUMENTS

| | | | | | |
|---|---|---|---|---|---|
| 5,529,956 | A | * | 6/1996 | Morishita | 438/639 |
| 6,030,663 | A | * | 2/2000 | McClain et al. | 427/389.9 |
| 6,500,605 | B1 | * | 12/2002 | Mullee et al. | 430/329 |
| 6,689,700 | B1 | * | 2/2004 | Watkins et al. | 438/762 |
| 6,703,316 | B2 | * | 3/2004 | Inoue et al. | 438/710 |
| 6,763,840 | B2 | * | 7/2004 | DeSimone et al. | 134/109 |
| 6,858,089 | B2 | * | 2/2005 | Castrucci | 134/2 |
| 6,905,556 | B1 | * | 6/2005 | Humayun et al. | 134/36 |
| 7,119,418 | B2 | * | 10/2006 | Xu et al. | 257/639 |
| 7,226,512 | B2 | * | 6/2007 | Fury et al. | 134/21 |
| 2002/0192938 | A1 | * | 12/2002 | Wada et al. | 438/618 |
| 2005/0158477 | A1 | * | 7/2005 | Vezin et al. | 427/430.1 |
| 2005/0272248 | A1 | * | 12/2005 | Kloster et al. | 438/618 |
| 2006/0154482 | A1 | | 7/2006 | Kondoh et al. | |
| 2006/0278254 | A1 | * | 12/2006 | Jackson | 134/21 |

FOREIGN PATENT DOCUMENTS

| | | |
|---|---|---|
| JP | 2004-207579 A | 7/2004 |
| JP | 2004-228526 A | 8/2004 |

* cited by examiner

*Primary Examiner*—Michael S Lebentritt
(74) *Attorney, Agent, or Firm*—McDermott Will & Emery LLP

(57) ABSTRACT

This invention provides a method for manufacturing a semiconductor silicon substrate by use of carbon dioxide in a supercritical state, which method is capable of making the semiconductor silicon substrate highly reliable one. Specifically, this invention provides a method for manufacturing a semiconductor silicon substrate including at least two of: a cleaning step of cleaning a substrate to be treated in a presence of carbon dioxide in a supercritical state; a film forming step of forming at least one of a conducting film, an insulating film and barrier film on the substrate to be treated in the presence of carbon dioxide in the supercritical state; an etching step of etching the substrate to be treated in the presence of carbon dioxide in the supercritical state; and a resist removing step of removing a resist on the substrate to be treated in the presence of carbon dioxide in the supercritical state.

12 Claims, 10 Drawing Sheets

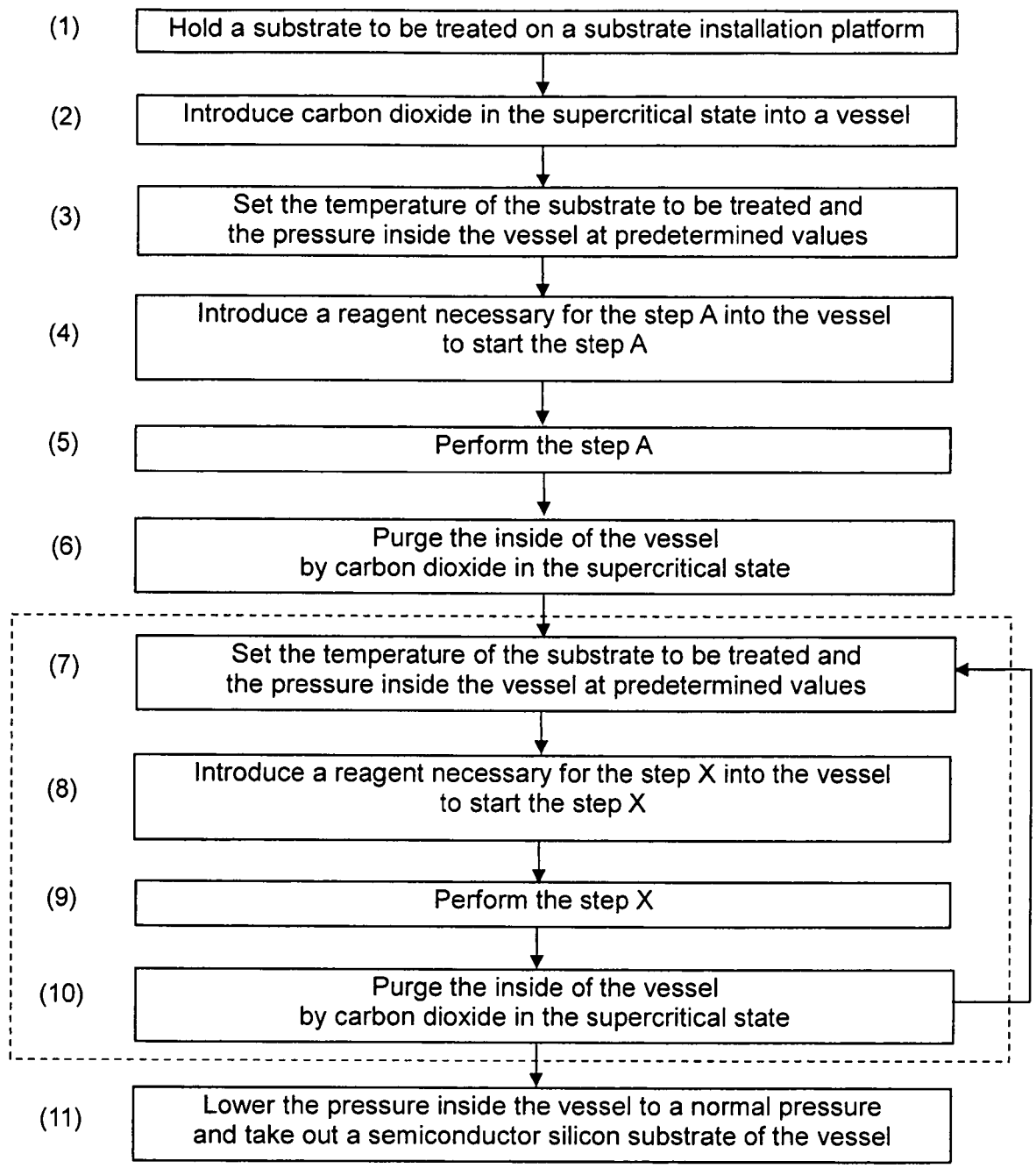

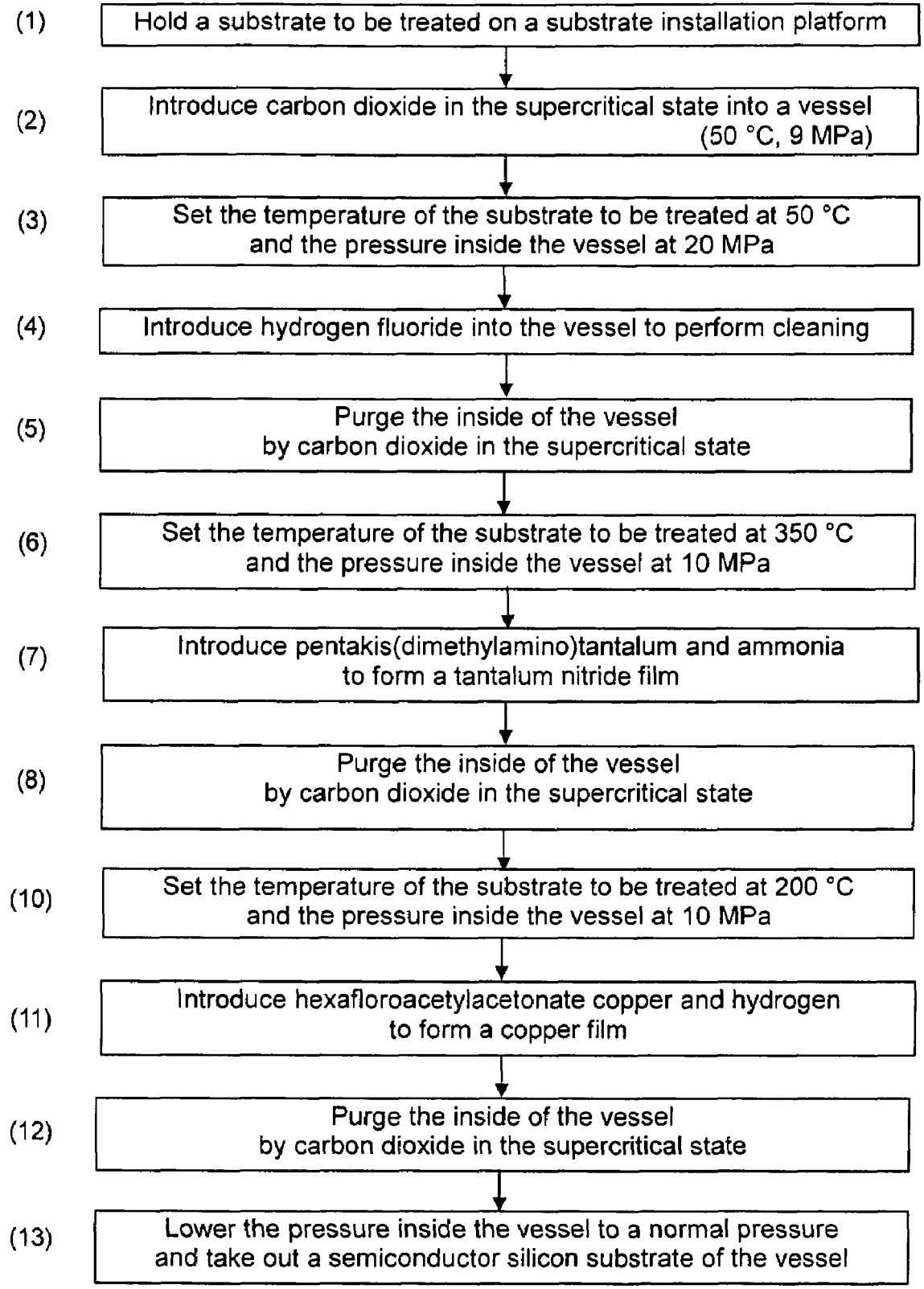

FIG. 7

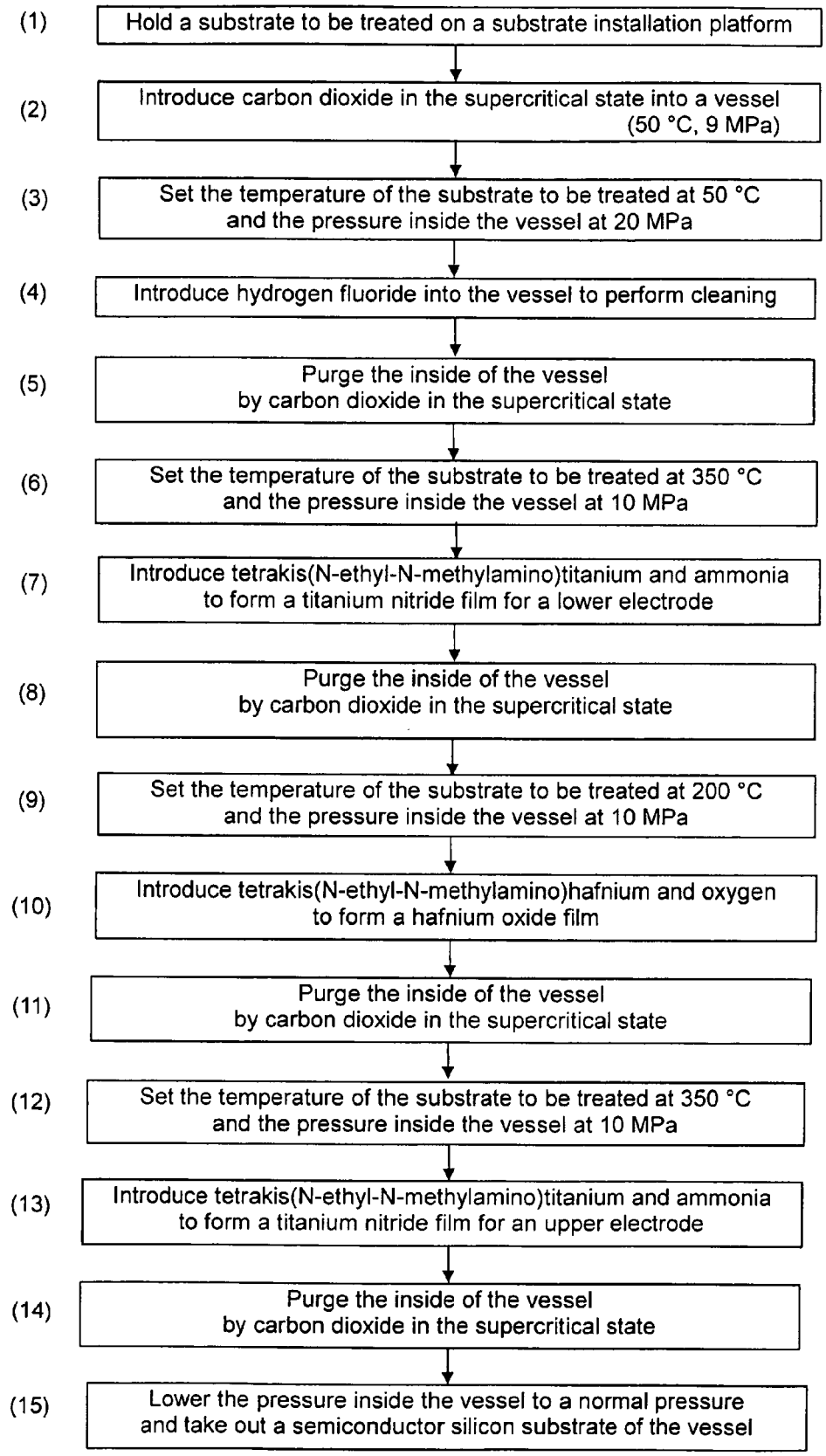

(1) Hold a substrate to be treated on a substrate installation platform (2) Introduce carbon dioxide in the supercritical state into a vessel (50 °C, 9 MPa)

(3) Set the temperature of the substrate to be treated at 50 °C and the pressure inside the vessel at 20 MPa (4) Introduce hydrogen fluoride into the vessel to perform cleaning (5) Purge the inside of the vessel by carbon dioxide in the supercritical state (6) Set the temperature of the substrate to be treated at 350 °C and the pressure inside the vessel at 10 MPa (7) Introduce tetrakis(N-ethyl-N-methylamino)titanium and ammonia to form a titanium nitride film for a lower electrode (8) Purge the inside of the vessel by carbon dioxide in the supercritical state (9) Set the temperature of the substrate to be treated at 200 °C and the pressure inside the vessel at 10 MPa

(10) Introduce tetrakis(N-ethyl-N-methylamino)hafnium and oxygen to form a hafnium oxide film

(11) Purge the inside of the vessel by carbon dioxide in the supercritical state

(12) Set the temperature of the substrate to be treated at 350 °C and the pressure inside the vessel at 10 MPa

(13) Introduce tetrakis(N-ethyl-N-methylamino)titanium and ammonia to form a titanium nitride film for an upper electrode

(14) Purge the inside of the vessel by carbon dioxide in the supercritical state

(15) Lower the pressure inside the vessel to a normal pressure and take out a semiconductor silicon substrate of the vessel

FIG.8
(a)
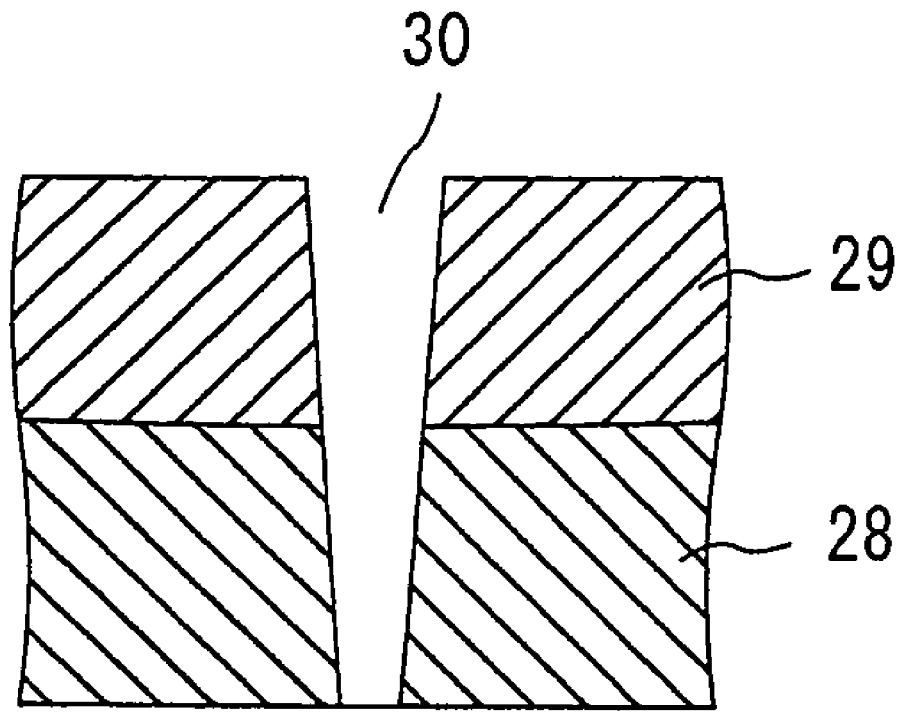
(b)
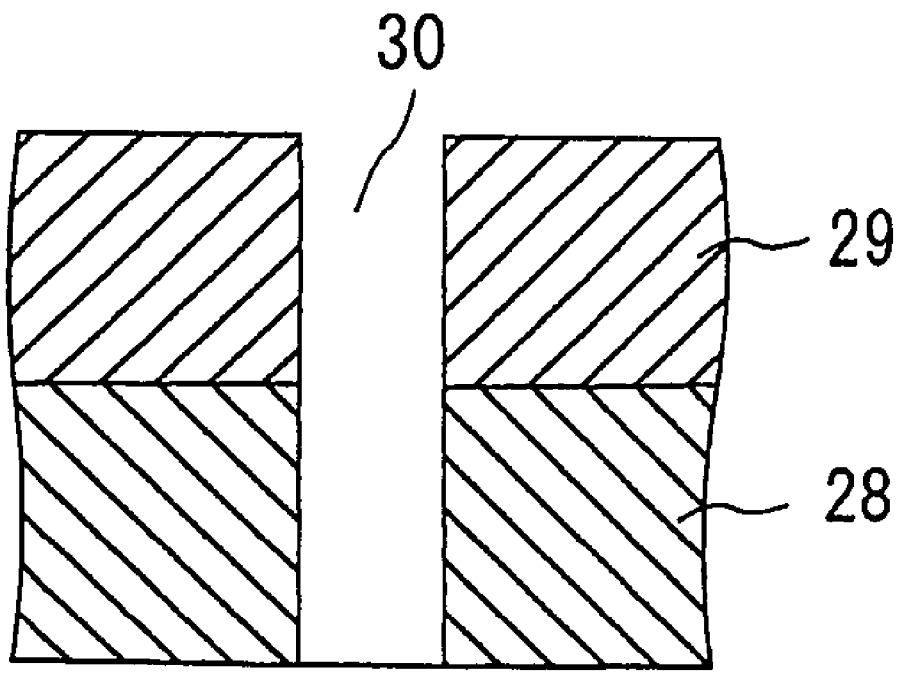

FIG.10
(a) 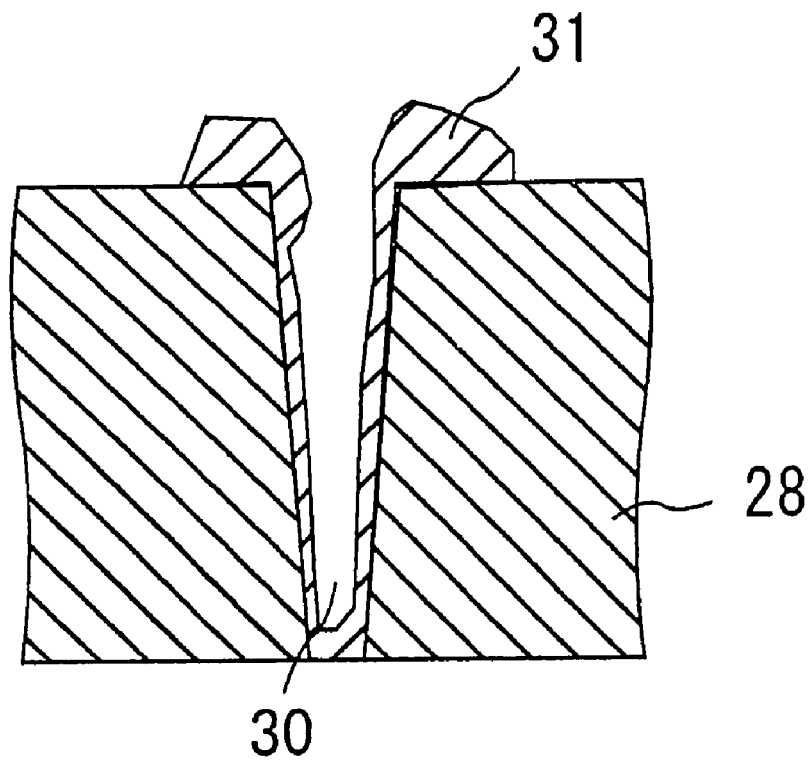
(b) 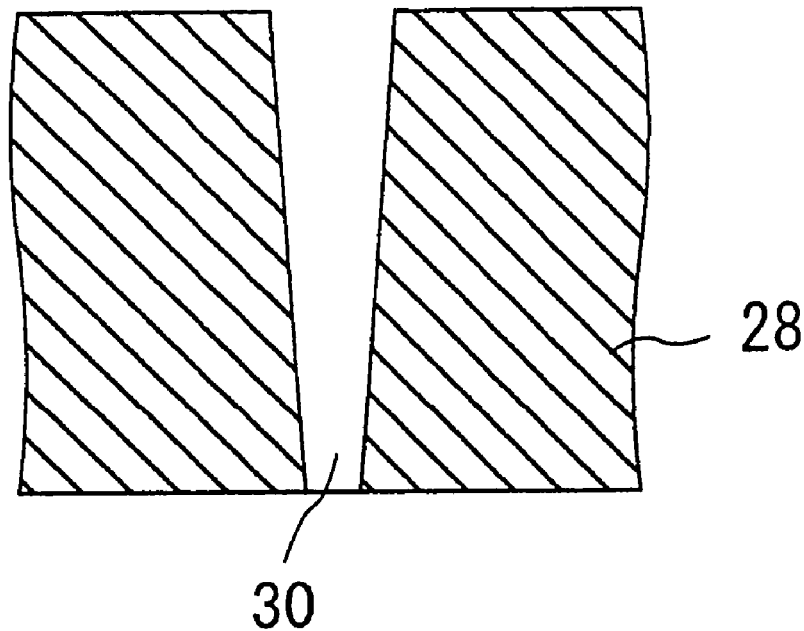

METHOD FOR MANUFACTURING SEMICONDUCTOR SILICON SUBSTRATE AND APPARATUS FOR MANUFACTURING THE SAME

BACKGROUND OF THE INVENTION

1. Field of the Invention

The present invention relates to a method for manufacturing a semiconductor silicon substrate. Particularly, the present invention relates to a method for manufacturing a semiconductor silicon substrate including at least two of cleaning, film forming, etching and resist removing in the presence of carbon dioxide in a supercritical state and an apparatus for manufacturing the same.

2. Description of the Related Art

Since carbon dioxide in a supercritical state has both liquid and gas properties, utilization of the carbon dioxide in the supercritical state in a semiconductor-related field has been proposed in recent years.

Specifically, there is proposed a method for forming both a copper diffusion prevention film and a copper film on a substrate to be treated while supplying the carbon dioxide in the supercritical state to the substrate to be treated (see Japanese Patent Application Publication No. 2004-228526).

With this method, formation of the copper diffusion prevention film and embedding of the copper film are made possible even for extremely fine patterns.

Meanwhile, there is also proposed an apparatus, having a plurality of treatment chambers such as a sealable replacement chamber, a supercritical chamber and a decompression chamber, for cleaning a semiconductor silicon substrate by use of carbon dioxide in the supercritical state (Japanese Patent Application Publication No. 2004-207579).

This apparatus makes it possible to shorten the treatment time of drying of the semiconductor silicon substrate by use of carbon dioxide in the supercritical state.

BRIEF SUMMARY OF THE INVENTION

However, the reliability of wiring obtained by the method disclosed in the a forementioned Japanese Patent Application Publication No. 2004-228526 becomes sometimes lower because, for example, the resistance value of the wiring becomes larger than expected or disconnection occurs, in particular as the wiring pattern has a higher aspect ratio and a finer pattern.

In addition, as the apparatus disclosed in the aforementioned Japanese Patent Application Publication No. 2004-207579 include the plural treatment chambers, there is a need to move the substrate to be treated after each treatment step, which sometimes makes the apparatus large-sized and expensive.

The present invention has a first object to provide a method for manufacturing a semiconductor silicon substrate by use of carbon dioxide in a supercritical state, the method capable of providing a semiconductor silicon substrate of higher reliability than those obtained by other semiconductor silicon substrate manufacturing methods using carbon dioxide in the supercritical state.

The present invention has a second object to provide a manufacturing apparatus of simple configuration which is suitable to manufacture such a semiconductor silicon substrate of higher reliability as mentioned above.

The present inventors have found out that mere use of carbon dioxide in a supercritical state is not enough to manufacture a semiconductor silicon substrate of high reliability.

Then, after extensive investigations, the inventors have completed the present invention by finding out that the first object is achieved by a method for manufacturing a semiconductor silicon substrate including at least two of cleaning, film forming, etching and resist removing a substrate to be treated in the presence of carbon dioxide in the supercritical state of temperature and pressure mentioned below, and that the second object is achieved by an apparatus for manufacturing a semiconductor silicon substrate having at least: first means for maintaining the carbon dioxide in a chamber at temperatures ranging from 31 to 100° C. and at pressures ranging from 18 to 40 MPa; and second means for maintaining the carbon dioxide in the chamber at temperatures ranging from 150 to 350° C. and at pressures ranging from 7.5 to 12 MPa.

Specifically, the present invention provides:

[1] a method for manufacturing a semiconductor silicon substrate comprising at least two of:

a cleaning step of cleaning a substrate to be treated in a presence of carbon dioxide in a supercritical state under conditions of a temperature of from 31 to 100° C. and a pressure of from 18 to 40 MPa;

a film forming step of forming at least one of a conducting film, an insulating film and barrier film on the substrate to be treated in the presence of carbon dioxide in the supercritical state under conditions of a temperature of from 150 to 350° C. and a pressure of from 7.5 to 12 MPa;

an etching step of etching the substrate to be treated in the presence of carbon dioxide in the supercritical state under conditions of a temperature of from 31 to 100° C. and a pressure of from 18 to 40 MPa; and a resist removing step of removing a resist on the substrate to be treated in the presence of carbon dioxide in the supercritical state under conditions of a temperature of from 31 to 80° C. and a pressure of from 18 to 40 MPa.

Further, the present invention provides:

[2] the method of the above item [1], in which the film forming step is an essential step and of forming a wiring structure on the substrate to be treated, the film forming step including at least:

a first step of forming the barrier film on the substrate to be treated in the presence of carbon dioxide in the supercritical state under conditions of a temperature of from 200 to 350° C. and a pressure of from 7.5 to 12 MPa; and a second step of forming the conducting film on the substrate to be treated in the presence of carbon dioxide in the supercritical state under conditions of a temperature of from 150 to 300° C. and a pressure of from 7.5 to 12 MPa.

Furthermore, the present invention provides:

[3] the method of the above item [1], in which film forming step is an essential step and of forming a capacitor structure on the substrate to be treated, the film forming step including at least:

a first step of forming the conducting film on the substrate to be treated in the presence of carbon dioxide in the supercritical state under conditions of a temperature of from 200 to 350° C. and a pressure of from 7.5 to 12 MPa;

a second step of forming the insulating film in contact with the conducting film on the substrate to be treated in the presence of carbon dioxide in the supercritical state under conditions of a temperature of from 150 to 350° C. and a pressure of from 7.5 to 12 MPa; and a third step of forming the conducting film in contact with the insulating film on the substrate to be treated in the presence of carbon dioxide in the supercritical state under conditions of a temperature of from 200 to 350° C. and a pressure of from 7.5 to 12 MPa.

Furthermore, the present invention provides:

[4] the method of any one of the above items 1 to 3, in which the steps are performed with the substrate to be treated kept inside one vessel.

Furthermore, the present invention provides:

[5] a semiconductor device including a semiconductor silicon substrate obtained by the method of any one of the above items 1 to 4.

Furthermore, the present invention provides:

[6] an apparatus for manufacturing a semiconductor silicon substrate comprising at least:

a vessel having a substrate installation platform to hold a substrate to be treated inside the vessel and being hermetically sealable;

means for supplying carbon dioxide to the vessel;

means for supplying a reagent to the vessel;

temperature controlling means for controlling a temperature inside the vessel; and pressure controlling means for controlling a pressure inside the vessel, said temperature controlling means and said pressure controlling means having first means for keeping the carbon dioxide inside the vessel at the temperature of from 31 to 100° C. and the pressure of from 18 to 40 MPa, respectively, and second means for keeping the carbon dioxide inside the vessel at the temperature of from 150 to 350° C. and the pressure of from 7.5 to 12 MPa, respectively.

The method for manufacturing a semiconductor silicon substrate according to the above-mentioned items of the present invention is allowed to provide a semiconductor silicon substrate of high reliability.

Further, the apparatus for manufacturing a semiconductor silicon substrate according to the above-mentioned items of the present invention is suitable to provide a semiconductor silicon substrate of high reliability.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 5 is a process flow for explaining a method of manufacturing a semiconductor silicon substrate;

FIG. 6 is a process flow for explaining a manufacturing method of the example 1;

FIG. 7 is a process flow for explaining a manufacturing method of the example 2;

FIG. 8 is a substantial-part cross sectional view of a substrate to be treated for explaining an etching step of the example 3;

FIG. 10 is a substantial-part cross sectional view of a substrate to be treated for explaining an etching step of the example 4.

DETAILED DESCRIPTION OF THE INVENTION

Figure 1:
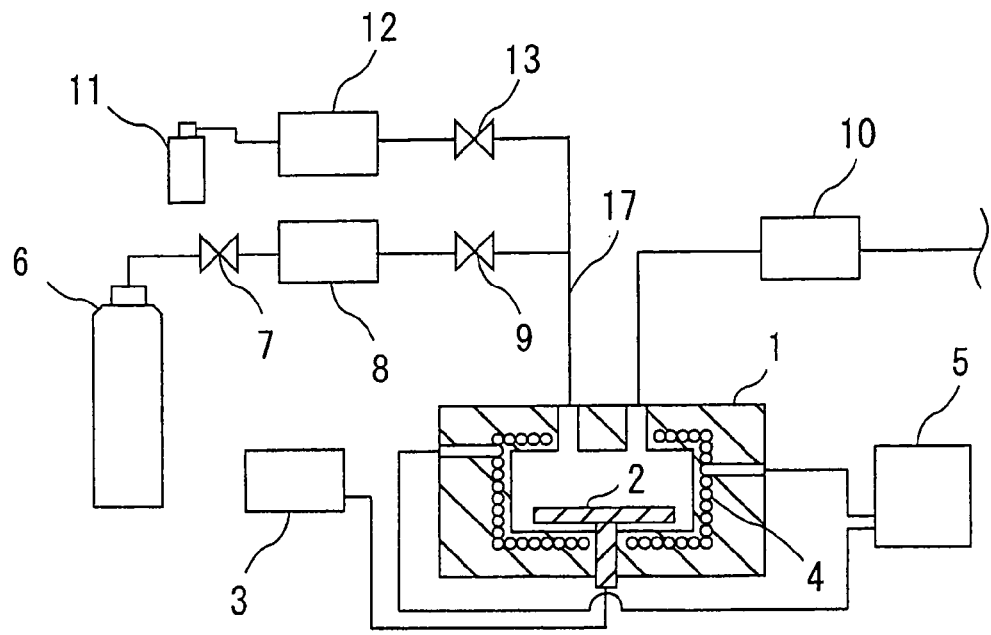
FIG. 1 is a view schematically illustrating the manufacturing apparatus of the present invention.

First description is made about a method for manufacturing a semiconductor silicon substrate of the present invention.

The manufacturing method of the present invention includes at least two of cleaning a substrate to be treated, film forming the substrate to be treated, etching the substrate to be treated and removing a resist on the substrate to be treated.

Here, the substrate to be treated may be exemplified by a semiconductor silicon wafer before being subjected to cleaning and film forming.

The substrate to be treated is not limited to a semiconductor silicon wafer itself obtained by cutting a semiconductor single crystal silicon ingot, but may be a semiconductor silicon wafer subjected to one or more of front-end steps including epitaxial layer forming, isolation forming, well forming, gate insulating film forming, gate electrode forming, spacer forming, source/drain forming, capacitor structure forming, contact forming, interlayer insulating film forming before metal wiring and flattening, and back-end steps, following the front-end steps, including contact plug forming, interlayer insulating film forming, flattening, metal electrode wiring structure forming and passivation film forming.

Next description is made about the cleaning step in the present invention.

Cleaning in the present invention applies to a substrate to be treated.

Cleaning needs to be carried out in the presence of carbon dioxide in a supercritical state.

Here, the carbon dioxide in the supercritical state means carbon dioxide under the condition that the temperature and/or pressure is beyond the critical points of carbon dioxide of a temperature of 31° C. and a pressure of 7.38 MPa. In this condition, the carbon dioxide exhibits both liquid and gas properties.

Cleaning in the present invention is carried out under conditions of a temperature of from 31 to 100° C. and a pressure of from 18 to 40 MPa in the supercritical state.

When the temperature is lower than 31° C., the carbon dioxide is in a liquid state, and accordingly, cleaning efficiency is significantly decreased due to slower transfer from the substrate surface of contaminant eliminated from the substrate to be treated and slower transfer of cleaning reagent to the substrate surface.

Moreover, when the temperature exceeds 100° C., carbon dioxide in a supercritical state comes to have a low density as in a gaseous state, and therefore sufficiently high solubility of contaminant cannot be obtained.

The temperature preferably ranges from 35 to 90° C., and more preferably ranges from 40 to 80° C.

Furthermore, when the pressure is lower than 18 MPa, sufficiently high solubility of the contaminant cannot be obtained, and therefore, the reliability of the obtained semiconductor silicon substrate is reduced.

Moreover, when the pressure exceeds 40 MPa, reactors, pumps, high-pressure valves, various high-pressure piping components and the like which constitute a manufacturing apparatus of the present invention are overloaded. Moreover, also when the pressure exceeds 40 MPa, an increase in density relative to pressure becomes negligibly small, and an increase in solubility at pressures exceeding 40 MPa is small.

Accordingly, the use of carbon dioxide at pressures exceeding 40 MPa cannot be deemed efficient from the view point described above.

The pressure preferably ranges from 20 to 40 MPa, and more preferably ranges from 23 to 40 MPa.

In cleaning in the present invention a cleaning reagent can be used.

The cleaning reagent may be specifically exemplified by hexafluoroacetylacetonate, acetylacetone, ethylacetoacetate, dimethylmaleate, 1,1,1-trifluoropentane-2,4-dione, 2,6-dimethylpentanedione-3,5-dione, 2,2,7-trimethyloctane-2,4-dione, 2,2,6,6-tetramethylheptane-3,5-dione, a chelating agent such as ethylenediaminetetraacetic acid, an organic acid such as formic acid, acetic acid, oxalic acid, maleic acid, and nitrilotriacetic acid, an inorganic acid such as hydrogen chloride, hydrogen fluoride, and phosphoric acid, a nitrogen-containing compound such as ammonia and ethanolamine, a hydroxy compound such as water, methanol, ethanol and propanol, and a surface active agent such as perfluoropolyether (PFPE).

The cleaning reagent to be used can be one kind or a combination of two or more kinds.

Next description is made about the film forming step in the present invention.

Film forming in the present invention is to form at least one of a conducting film, an insulating film and a barrier film on the substrate to be treated.

Film forming needs to be carried out in the presence of carbon dioxide in a supercritical state.

Film forming in the present invention is carried out under conditions of a temperature of from 150 to 350° C. and a pressure of from 7.5 to 12 MPa in the supercritical state.

When the temperature is lower than 150° C., it is difficult to obtain enough reaction heat to form a film of excellent film property, which applies to all type of films to be formed. In addition, when the temperature exceeds 350° C., there may occur a decrease in pressure tightness of various stainless portions including a high-pressure container and deterioration in a high-pressure sealing portion.

The temperature preferably ranges from 150 to 300° C. and more preferably, ranges from 150 to 250° C.

When the pressure is lower than 7.5 MPa, the density of the carbon dioxide is not sufficiently high, and therefore, a film forming precursor becomes difficult to dissolve. When the pressure exceeds 12 MPa, the viscosity of the carbon dioxide is increased, and the precursor becomes difficult to enter a fine structure, which results in occurring defects such as voids in the fine structure and unevenness of the film in the fine structure.

The pressure preferably ranges from 8 to 12 MPa, and more preferably ranges from 8 to 11 MPa.

The film forming step in the manufacturing method of the present invention is at least one of front-end steps including epitaxial layer forming, isolation forming, well forming, gate insulating film forming, gate electrode forming, spacer forming, source/drain forming, capacitor structure forming, contact forming and interlayer insulating film forming before metal wiring, and back-end steps, following the front-end steps, including contact plug forming, interlayer insulating film forming, metal electrode wiring structure forming and passivation film forming.

Among these steps, film forming in the present invention is preferably capacitor structure forming, contact plug forming, or metal electrode wiring structure forming.

The conducting film is, for example, a wiring film or electrode film.

More specifically, the conducting film may be exemplified by a metal film consisting of copper, gold, aluminum, tungsten or the like, a polycrystal film consisting of polysilicon or the like, a silicide film consisting of tungsten silicide, molybdenum silicide, titanium silicide, cobalt silicide, nickel silicide or the like, an oxide film consisting of iridium oxide, ruthenium oxide or the like, a nitride film consisting of titanium nitride, tantalum nitride or the like.

The conducting film can be one kind or a combination of two or more kinds.

The insulating film is, for example, a gate film, a device separating film, a capacitor insulating film, an interlayer insulating film, or a passivation film.

More specifically, the insulating film may be exemplified by an oxide film of Silicon oxide, Hafnium oxide, tantalum oxide, aluminum oxide, or the like, a nitride film of silicon nitride or the like and a glass film of phosphorous silicate glass, boron silicate glass, boron phosphorous silicate glass or the like.

The insulating film may be one kind or a combination of two or more kinds.

The barrier film may be exemplified by an inorganic film of titanium nitride, titanium tungsten, tungsten nitride, tantalum nitride or the like.

The barrier film may be one kind or a combination of two or more kinds.

Film forming can be carried out by causing the film forming precursor to act on the substrate to be treated, dissolving a film forming precursor in the carbon dioxide in the supercritical state in advance and causing such a dissolved material to act on the substrate tobe treated, or causing a film forming precursor dissolved in the carbon dioxide in the supercritical state and a reaction reagent to react on the substrate to be treated.

The reaction reagent may be one or a combination of two of oxygen, ozone, hydrogen, nitrogen, ammonia, hydrogen peroxide, water, or the like.

The film forming precursor may be exemplified by a barrier film precursor reagent, a wiring film precursor reagent, an electrode film precursor reagent and a capacitor insulating film precursor reagent.

A barrier film is formed on the substrate to be treated by, for example, causing the barrier film precursor regent to react with a reaction agent, which is one or more of nitrogen, ammonia and the like, on the substrate to be treated in the presence of carbon dioxide in the supercritical state.

Barrier film forming is preferably carried out under conditions of a temperature of from 200 to 350° C. and a pressure of from 7.5 to 12 MPa.

In these conditions, preferably, the temperature ranges from 250 to 350° C. and the pressure ranges from 8 to 12 MPa. More preferably, the temperature ranges from 300 to 350° C. and the pressure ranges from 8 to 11 MPa.

Specifically, the barrier film precursor reagent is, for example, pentakis(dimethylamino)tantalum.

For example, when the pentakis (dimethylamino)tantalum is made to react with ammonia on the substrate to be treated, tantalum nitride is deposited on the substrate to be treated, and thereby a tantalum nitride film is formed on the substrate to be treated.

Moreover, when a wiring film is formed on the substrate to be treated, the wiring film is formed by, for example, causing the wiring film precursor regent to react with a reaction agent, such as hydrogen, on the substrate to be treated in the presence of carbon dioxide in the supercritical state.

Wiring film forming is preferably carried out under conditions of a temperature of from 150 to 300° C. and a pressure of from 7.5 to 12 MPa.

In these conditions, preferably, the temperature ranges from 200 to 300° C. and the pressure ranges from 8 to 12 MPa. More preferably, the temperature ranges from 250 to 300° C. and the pressure ranges from 8 to 11 MPa.

Specifically, the wiring film precursor reagent is, for example, hexafloroacetylacetonate copper.

For example, when the hexafloroacetylacetonate copper is made to react with hydrogen on the substrate tobe treated, copper is deposited on the substrate to be treated, and thereby a copper film is formed on the substrate to be treated.

Moreover, when an electrode film is formed on the substrate to be treated, the electrode film is formed by, for example, causing the electrode film precursor reagent to react with a reaction agent, which is one or a combination of two or more of hydrogen, nitrogen, ammonia and the like, on the substrate to be treated in the presence of carbon dioxide in the supercritical state.

Electrode film forming is preferably carried out under conditions of a temperature of from 200 to 350° C. and a pressure of from 7.5 to 12 MPa.

In these conditions, preferably, the temperature ranges from 250 to 350° C. and the pressure ranges from 8 to 12 MPa. More preferably, the temperature ranges from 300 to 350° C. and the pressure ranges from 8 to 11 MPa.

Specifically, the electrode film precursor reagent is, for example, tetrakis(N-ethyl-N-methylamino)titanium.

For example, when the tetrakis (N-ethyl-N-methylamino) titanium is made to react with ammonia on the substrate to be treated, titanium nitride is deposited on the substrate to be treated, and thereby a titanium nitride film is formed on the substrate to be treated.

Moreover, when a capacitor insulating film is formed on the substrate to be treated, the capacitor insulating film is formed by, for example, causing the capacitor insulating film precursor regent to act on the substrate to be treated in the presence of carbon dioxide in the supercritical state.

Capacitor insulating film forming is preferably carried out under conditions of a temperature of from 150 to 350° C. and a pressure of from 7.5 to 12 MPa.

In these conditions, preferably, the temperature ranges from 200 to 350° C. and the pressure ranges from 8 to 12 MPa. More preferably, the temperature ranges from 250 to 350° C. and the pressure ranges from 8 to 11 MPa.

Specifically, the capacitor insulating film precursor reagent is, for example, tetrakis(N-ethyl-N-methylamino)hafnium.

For example, when the tetrakis(N-ethyl-N-methylamino) hafnium is made to react with oxygen on the substrate tobe treated, hafnium oxide is deposited on the substrate to be treated, and thereby a hafnium oxide film is formed on the substrate to be treated.

The film forming precursor can be one kind or a combination of two or more kinds.

Next description is made about the etching step in the present invention.

Etching in the present invention is to perform etching on the substrate to be treated.

Etching in the present invention is carried out under conditions of a temperature of from 31 to 100° C. and a pressure of from 18 to 40 MPa in the supercritical state.

When the temperature is lower than 31° C., the carbon dioxide is in a liquid state, and accordingly, etching efficiency is significantly decreased due to slower etching of the substrate to be treated.

Moreover, when the temperature exceeds 100° C., carbon dioxide in a supercritical state comes to have a low density like in a gaseous state, and therefore sufficiently high solubility cannot be obtained.

The temperature preferably ranges from 35 to 90° C., and more preferably ranges from 40 to 80° C.

Furthermore, when the pressure is lower than 18 MPa, etching efficiency is also significantly decreased due to slower etching of the substrate to be treated.

Moreover, when the pressure exceeds 40 MPa, reactors, pumps, high-pressure valves, various high-pressure piping components and the like which constitute a manufacturing apparatus of the present invention are overloaded. Moreover, also when the pressure exceeds 40 MPa, an increase in density relative to pressure becomes negligibly small, and an increase in solubility at pressures exceeding 40 MPa is small.

Accordingly, the use of carbon dioxide at pressures exceeding 40 MPa cannot be deemed efficient from the viewpoint described above.

The pressure preferably ranges from 20 to 40 MPa, and more preferably ranges from 23 to 40 MPa.

Etching can be carried out with an etching reagent.

The etching reagent may be specifically exemplified by hydrogen fluoride and the like.

Next description is made about the resist removing step in the present invention.

Resist removing in the present invention is to remove a resist on the substrate to be treated.

Resist removing in the present invention is carried out under conditions of a temperature of from 31 to 80° C. and a pressure of from 18 to 40 MPa in the supercritical state.

When the temperature is lower than 31° C., the carbon dioxide is in a liquid state, and accordingly, resist removing efficiency is significantly decreased due to slower resist removing of the substrate to be treated.

Moreover, when the temperature exceeds 80° C., carbon dioxide in a supercritical state comes to have a low density like in a gaseous state, and therefore sufficiently high solubility for resist removing cannot be obtained.

The temperature preferably ranges from 35 to 80° C., and more preferably ranges from 40 to 80° C.

Furthermore, when the pressure is lower than 18 MPa, resist removing efficiency is also significantly decreased due to slower resist removing of the substrate to be treated.

Moreover, when the pressure exceeds 40 MPa, reactors, pumps, high-pressure valves, various high-pressure piping components and the like which constitute a manufacturing apparatus of the present invention are overloaded. Moreover, also when the pressure exceeds 40 MPa, an increase in density relative to pressure becomes negligibly small, and an increase in solubility at pressures exceeding 40 MPa is small.

Accordingly, the use of carbon dioxide at pressures exceeding 40 MPa cannot be deemed efficient from the viewpoint described above.

The pressure preferably ranges from 20 to 40 MPa, and more preferably ranges from 23 to 40 MPa.

Resist removing can be carried out with a resist removing reagent.

The resist removing reagent may be specifically exemplified by alcohols including methanol, ethanol and propanol.

In the manufacturing method according to the present invention, the steps described above can be continuously carried out in a single manufacturing device.

Through the processes described above, a semiconductor silicon substrate can be obtained.

Then, the semiconductor silicon substrate is used to obtain a semiconductor device such as DRAM.

Next description is made about a manufacturing apparatus of the present invention with reference to the drawings.

FIG. 1 is a view schematically illustrating the manufacturing apparatus of the present invention.

A vessel 1 is provided with a substrate installation platform 2 to hold a substrate to be treated inside the vessel. After the substrate to be treated is installed in the vessel 1, the vessel 1 can be hermetically sealed.

The vessel 1 includes: a temperature controller 3 for heating the substrate installation platform 2 as temperature controlling means for adjust the internal temperature of the vessel 1; and a cooling water circulating channel 4 for lowering the inner wall temperature of the vessel 1. The cooling water circulating channel 4 is connected to a cooling water circulator 5 so that cooling water can circulate inside the cooling water circulating channel 4. This circulation of cooling water can lower the inner wall temperature of the vessel 1.

The substrate to be treated held on the substrate installation plat form 2 is heated by a heater (not shown) provided on the substrate installation platform 2 through the temperature controller 3.

The temperature controller 3 and the cooling water circulator 5 work with temperature detecting means such as a thermocouple provided inside the vessel 1, on the substrate installation platform 2 or the like to control the temperature around the substrate installation platform 2 inside the vessel 1.

In addition, the cooling water circulator 5 serves to prevent the vessel from being excessively heated, and the temperature change inside the vessel 1 can be precisely controlled particularly around the substrate installation platform 2 inside the vessel 1 or the substrate provided thereon. For this reason, steps including cleaning and film forming of the substrate can be performed on the surface of the substrate to be treated and prompt heating and cooling of the substrate to be treated can be performed.

Meanwhile, the vessel 1 is also provided with a carbon dioxide cylinder 6, a high-pressure valve 7 and a carbon dioxide supplying high-pressure pump 8, all as means for supplying carbon dioxide.

Further, the vessel 1 is provided with the carbon dioxide supplying high-pressure pump 8 and a back pressure regulator 10 as pressure controlling means for controlling the internal pressure of the vessel 1.

The back pressure regulator 10 is provided with pressure detecting means to lower the pressure inside the vessel 1 by releasing carbon dioxide inside the vessel 1 to the outside when the pressure inside the vessel 1 is high. When the pressure inside the vessel 1 is low, the carbon dioxide supplying high-pressure pump 8 is used to supply carbon dioxide into the vessel 1 thereby to increase the pressure inside the vessel 1.

Specifically, for example, the carbon dioxide supplying high-pressure pump 8 serves to supply carbon dioxide of the carbon dioxide cylinder 6 inside the vessel 1 at a constant flow rate and the back pressure regulator 10 operates to keep a predetermined pressure of the vessel 1.

In other words, when the pressure inside the vessel 1 is high, a valve of the back pressure regulator 10 is opened to release excessive carbon dioxide inside the vessel 1 to the outside thereby to lower the pressure inside the vessel 1. On the other hand, when the pressure inside the vessel 1 is low, as the valve of the back pressure regulator 10 is closed, carbon dioxide is supplied from the carbon dioxide supplying high-pressure pump 8 to the inside of the vessel 1 thereby to increase the pressure inside the vessel 1.

The back pressure regulator 10 works with pressure detecting means such as a pressure gauge provided on the back pressure regulator 10 to control the pressure inside the vessel 1 to be a given pressure.

The vessel 1 is further provided with a reagent vessel 11, a reagent adding pump 12 and a reagent adding valve 13.

Introduction of a reagent into the vessel 1 is carried out through the reagent adding pump 12 and the reagent adding valve 13.

Here, for ease of explanation, the means for supplying a reagent illustrated in FIG. 1 is a reagent vessel 11 for one kind reagent. If plural kinds of reagents are used, necessary reagent vessels may be prepared to be coupled to the reagent adding pump 12 or plural pumps may be used corresponding to the reagent adding pump 12.

Figure 2:
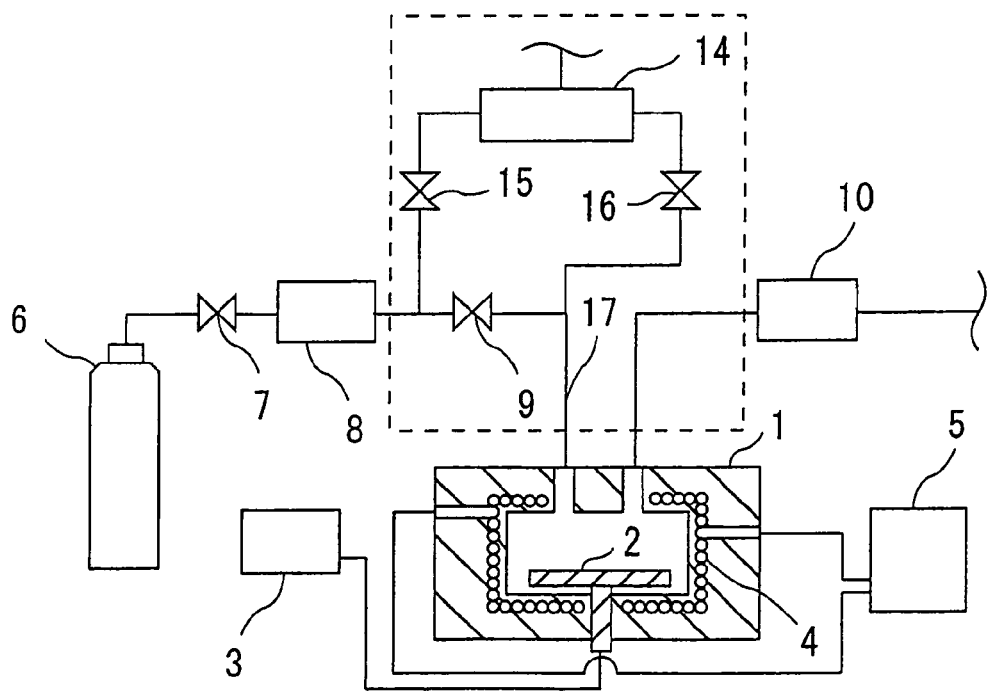
FIG. 2 is a view schematically illustrating the configuration of a manufacturing apparatus of the present invention provided with a solid reagent dissolving chamber.

FIG. 2 is a view schematically illustrating the configuration of a manufacturing apparatus of the present invention provided with a reagent dissolving chamber.

The reagent dissolving chamber 14 is connected to a carbon dioxide supplying pipe 17 via valves 15 and 16.

The reagent dissolving chamber 14 is provided with solid carrying means such as a screw feeder (not shown), with which a reagent can be supplied to the reagent dissolving chamber 14 even when the reagent is solid.

When the reagent used in the present invention is solid, the solid reagent is introduced to the reagent dissolving chamber 14 and dissolved with carbon dioxide in the supercritical state before being introduced into the vessel 1.

Figure 3:
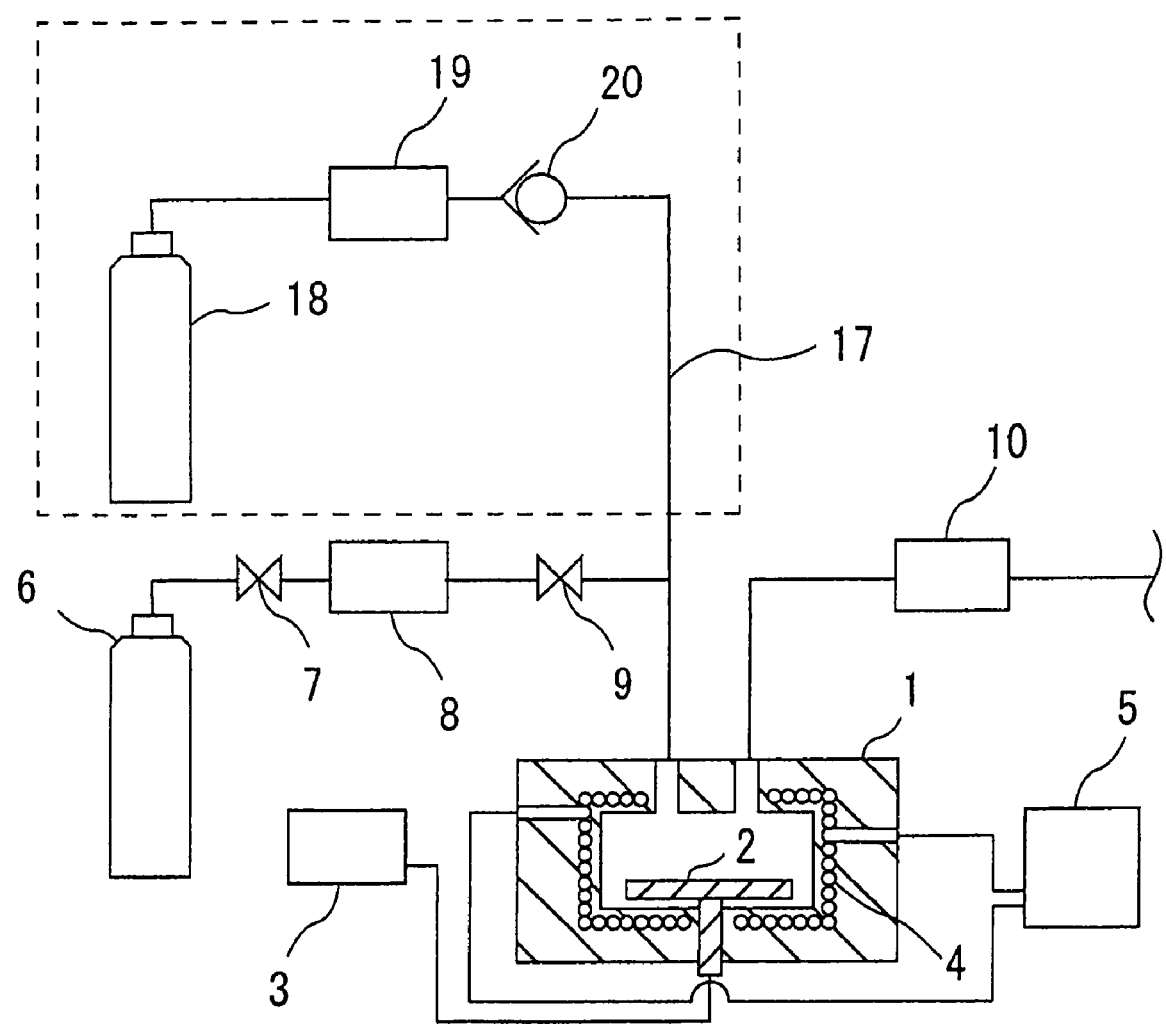
FIG. 3 is a view schematically illustrating the configuration of a manufacturing apparatus of the present invention provided with a mass flow controller 19 for introducing a gaseous reagent.

FIG. 3 is a view schematically illustrating a manufacturing apparatus of the present invention provided with a mass flow controller 19 for introducing a reagent.

The manufacturing apparatus illustrated in FIG. 3 is provided with gas carrying means such as a gaseous reagent cylinder 18, the mass flow controller 19 and a check valve 20.

The mass flow controller 19 is used to control a flow rate of a gaseous reagent of the gaseous reagent cylinder 18 to the vessel 1. Besides, the check valve 20 is used to prevent contents of the vessel 1 from flowing back from the vessel 1 to the gaseous reagent cylinder 18.

FIGS. 1 to 3 illustrate manufacturing apparatus using, a liquid reagent, a solid reagent and a gaseous reagent, respectively. The present invention is not limited to one of them, but can be a manufacturing apparatus using more than one of the liquid reagent, the solid reagent and the gaseous reagent.

Next description is made about the reagent used in the present invention.

The reagent used in a manufacturing apparatus of the present invention includes: for example, a cleaning reagent; an etching reagent; and a resist removing reagent.

The cleaning reagent may be specifically exemplified by hexafluoroacetylacetonate, acetylacetone, ethylacetoacetate, dimethylmaleate, 1,1,1-trifluoropentane-2,4-dione, 2,6-dimethylpentanedione-3,5-dione, 2,2,7-trimethyloctane-2,4-dione, 2,2,6,6-tetramethylheptane-3,5-dione, a chelating agent such as ethylenediaminetetraacetic acid, an organic acid such as formic acid, acetic acid, oxalic acid, maleic acid, and nitrilotriacetic acid, an inorganic acid such as hydrogen chloride, hydrogen fluoride, and phosphoric acid, a nitrogen-containing compound such as ammonia and ethanolamine, a hydroxy compound such as water, methanol, ethanol and propanol, and a surface active agent such as perfluoropolyether (PFPE)

The cleaning reagent to be used can be one kind or a combination of two or more kinds.

The film forming reagent includes: for example, a barrier film precursor reagent; a wiring film precursor reagent; an electrode precursor reagent; and a capacitor insulating film precursor reagent.

The barrier film precursor reagent may be specifically exemplified by pentakis(dimethylamino)tantalum.

The wiring film precursor reagent may be specifically exemplified by hexafloroacetylacetonate copper.

The electrode precursor reagent may be specifically exemplified by tetrakis(N-ethyl-N-methylamino)titanium.

The capacitor insulating film precursor reagent may be specifically exemplified by tetrakis(N-ethyl-N-methylamino)hafnium.

The etching reagent may be specifically exemplified by hydrofluoric acid.

The resist removing reagent may be specifically exemplified by alcohols such as methanol, ethanol and propanol.

These reagents to be used can be one kind or a combination of two or more kinds.

Next description is made about the temperature and pressure when a manufacturing apparatus of the present invention is used.

The manufacturing apparatus of the present invention can be kept by the above-described temperature controlling means and the pressure controlling means to have carbon dioxide inside the vessel 1 at temperatures ranging from 31 to 100° C. and pressures ranging from 18 to 40 MPa and to have the carbon dioxide inside the vessel 1 at temperatures ranging from 150 to 350° C. and pressures ranging from 7.5 to 12 MPa.

Under these conditions, the carbon dioxide inside the vessel 1 can be kept in a supercritical state.

The temperature range of 31 to 100° C. and the pressure range of 18 to 40 MPa are requirements for the manufacturing apparatus to perform cleaning on the substrate to be treated.

When the temperature is lower than 31° C., the carbon dioxide is in a liquid state, and accordingly, cleaning efficiency is significantly decreased due to slower transfer from the substrate surface of contaminant eliminated from the substrate to be treated and slower transfer of cleaning reagent to the substrate surface. Moreover, when the temperature exceeds 100° C., carbon dioxide in a supercritical state comes to have a low density as in a gaseous state, and therefore sufficiently high solubility of contaminant cannot be obtained.

The temperature preferably ranges from 35 to 90° C., and more preferably ranges from 40 to 80° C.

Furthermore, when the pressure is lower than 18 MPa, sufficiently high solubility for cleaning the surface of the substrate to be treated cannot be obtained, and therefore, the reliability of the obtained semiconductor silicon substrate is reduced. Moreover, when the pressure exceeds 40 MPa, reactors, pumps, high-pressure valves, various high-pressure piping components and the like which constitute a manufacturing apparatus of the present invention are overloaded. Moreover, also when the pressure exceeds 40 MPa, an increase in density relative to pressure becomes negligibly small, and an increase in solubility at pressures exceeding 40 MPa is small.

Accordingly, the use of carbon dioxide at pressures exceeding 40 MPa cannot be deemed efficient from the viewpoint described above.

The pressure preferably ranges from 20 to 40 MPa, and more preferably ranges from 23 to 40 MPa.

The temperature range of 150 to 350° C. and the pressure range of 7.5 to 12 MPa are requirements for the manufacturing apparatus to perform film forming on the substrate to be treated.

When the temperature is lower than 150° C., it is difficult to obtain enough reaction heat to form a film of excellent film property, which applies to all type of films to be formed. In addition, when the temperature exceeds 350° C., there may occur a decrease in pressure tightness of various stainless portions including a high-pressure container and deterioration in a high-pressure sealing portion, and it becomes difficult to assure safety.

The temperature preferably ranges from 150 to 300° C. and more preferably, ranges from 150 to 250° C.

When the pressure is lower than 7.5 MPa, the density of the carbon dioxide is not sufficiently high, and therefore, a film forming precursor becomes difficult to dissolve. When the pressure exceeds 12 MPa, the viscosity of the carbon dioxide is increased, and the precursor becomes difficult to enter a fine structure, which results in occurring defects such as voids in the fine structure and unevenness of the film in the fine structure.

The pressure preferably ranges from 8 to 12 MPa, and more preferably ranges from 8 to 11 MPa.

The following description is made about a continuous treatment process of a semiconductor silicon substrate using a manufacturing apparatus of the present invention.

Figure 4:
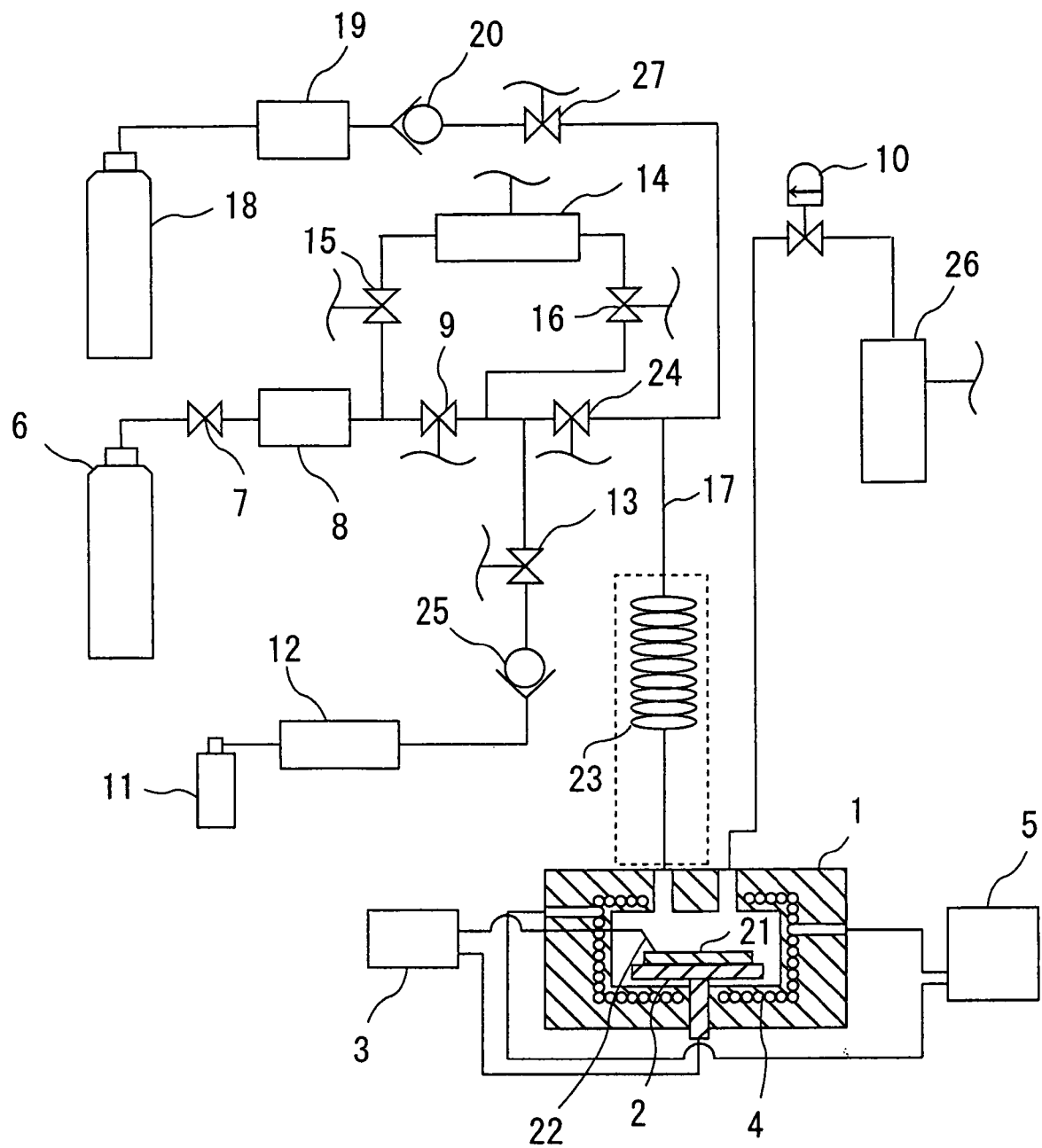
FIG. 4 is a view schematically illustrating the configuration of a manufacturing apparatus of the present invention provided with means for introducing a gaseous reagent, a solid reagent and a liquid reagent.

FIG. 4 is a view schematically illustrating a manufacturing apparatus according to an embodiment of the present invention.

FIG. 5 shows a process flow for explaining the continuous processing process of a semiconductor silicon substrate.

First, a substrate to be treated 21 is held on a substrate installation platform 2 inside the vessel 1 illustrated in FIG. 4 and the vessel 1 is hermetically sealed.

As shown in FIG. 5, the carbon dioxide cylinder 6, the carbon dioxide supplying high-pressure pump 8, the high-pressure valves 7, 9 and 24 are used to introduce carbon dioxide into the vessel 1.

The, heating means such as a heater (not shown) provided on the substrate installation platform 2 is used to heat the substrate to be treated. A thermocouple 22 is provided in contact with the substrate to be treated 21 to monitor the temperature of the substrate tobe treated 21. Depending on the temperature, when the temperature is shown to be low by the temperature controller 3, the heating means such as a heater is used to heat the substrate to be treated 21 and when the temperature is high, cooling water is supplied from the cooling water circulator 5 to the cooling water circulating channel 4 provided inside the vessel 1 to cool the vessel 1, thereby to keep the substrate to be treated 21 at a predetermined temperature. In this step, it is possible to control the pressure inside the vessel 1 and the temperature of the substrate to be treated to be predetermined values.

Then, a reagent necessary for a step A such as cleaning, film forming or the like is introduced into the vessel 1 and the step A is carried out.

For example, when the reagent used in the step A is liquid, the reagent can be introduced from the reagent vessel 11 into the vessel 1 via the reagent adding pump 12, the check valve 25, the reagent adding valve 13 and the high pressure valve 24.

Further, when the reagent used in the step A is gaseous, the reagent can be introduced from the gaseous reagent cylinder 18 to the vessel 1 via the mass flow controller 19, the check valve 20 and the high pressure valve 27.

Furthermore, when the reagent used in the step A is solid, the reagent is introduced into the reagent dissolving chamber 14 by use of the solid carrying means such as a screw feeder (not shown) and dissolved with carbon dioxide in the supercritical state separately introduced from the high pressure valve 15 before being introduced into the vessel 1 via the high pressure valves 16 and 24.

Here, the gaseous reagent, the liquid reagent and the solid reagent may be introduced into the vessel 1 independently or two or more of them may be combined to be introduced into the vessel 1.

The carbon dioxide supplying pipe 17 of the vessel 1 is provided with a mixing loop 23 for efficiently mixing the reagents. The mixing loop 23 is provided with heating means for converting the state of carbon dioxide in the mixing loop into a supercritical state.

In the embodiments of the present invention, the mixing loop 23 can be replaced with, or can be used together with, a separate mixing tank (not shown).

The mixing tank can be provided with agitating means such as a mechanical stirrer.

Introduction of the reagent may be carried out before the step A or during the step A continuously or intermittently.

After the step A is finished, pure carbon dioxide is supplied to the vessel 1 while the back pressure regulator 10 is opened appropriately thereby to remove the reagent and the like inside the vessel 1 in the purging step. Here, the reference numeral 26 denotes a reagent recovery chamber.

After the inside of the vessel 1 is filled with the pure carbon dioxide, the temperature of the substrate to be treated and the pressure inside the vessel 1 are controlled to be predetermined values suitable for the following step X.

The steps A and X are, for example, cleaning, film forming etching, resist removing and the like.

The step X may be one or more of them.

A reagent necessary for the step X is introduced into the vessel 1 to perform the step X.

As is the case with the step A, introduction of the reagent may be carried out before the step X or during the step X continuously or intermittently.

Then, after the step X is finished, pure carbon dioxide is supplied to the vessel 1 while the back pressure regulator 10 is opened appropriately thereby to remove the reagent and the like inside the vessel 1 in the purging step.

Then, the steps (7) to (10) of FIG. 5 can be repeated a necessary number of times.

After the process, supply of carbon dioxide into the vessel 1 is stopped and the carbon dioxide inside the vessel 1 is discharged from the back pressure regulator 10 to the outside to obtain a semiconductor silicon substrate.

With this continuous treatment process of the semiconductor silicon substrate, there is no need to take out the substrate to be treated from the vessel 1 after each step of the steps A and X. Further, the manufacturing apparatus can be down sized.

Furthermore, as the manufacturing apparatus is provided with the heating means such as a heater on the substrate installation platform 2, the temperature of the substrate to be treated can be controlled promptly and the time required for the continuous treatment process of the semiconductor silicon substrate can be shortened.

Next description is given in detail about a manufacturing method and a manufacturing apparatus of the present invention by way of examples. However, the examples are not for limiting the present invention.

EXAMPLE 1

FIG. 6 shows a process flow for explaining the manufacturing method of the present invention. The manufacturing method and a manufacturing apparatus of the present invention are described with reference to FIGS. 4 and 6.

First, a substrate to be treated was held on the substrate installation platform 2.

This substrate to be treated is one obtained by subjecting a semiconductor silicon wafer to the aforementioned front-end steps and then contact plug forming, interlayer insulating film forming and flattening of the back-end steps.

When the cleaning step of the manufacturing method of the present invention is performed, the temperature inside the vessel 1 was heated to be between 31 to 100° C., inclusive, and carbon dioxide was supplied to the inside of the vessel 1 through the carbon dioxide cylinder 6, the carbon dioxide supplying high-pressure pump 8, and high pressure valves 7 and 9 so that the pressure inside the vessel was controlled to be between 18 to 40 MPa, inclusive.

First, when the temperature of the substrate to be treated was set at 50° C. and the pressure inside the vessel 1 was set at 20 MPa, a cleaning reagent was introduced into the vessel 1 from the reagent vessel 11 via the reagent adding pump 12 and the reagent adding valve 13. Then, cleaning was performed to remove residues, organic contaminants and the like deposited on the surface of the substrate to be treated.

Such residues, organic contaminants and the like are solid or liquid residues after the etching step such as reactive ion etching, wet etching, dry etching or plasma etching, the chemical mechanical polishing (CMP) step or the resist removing step.

In this example, hydrofluoric acid was used as the cleaning reagent.

After cleaning, introduction of the cleaning reagent into the vessel 1 was stopped, and pure carbon dioxide was supplied to the vessel 1 through the carbon dioxide cylinder 6, the carbon dioxide supplying high-pressure pump 8, the high-pressure valves 7 and 9 while purging was performed to discharge the cleaning reagent inside the vessel 1 from the back pressure regulator 10 to the outside.

Through this step, the inside of the vessel 1 was filled with the pure carbon dioxide.

Then, the temperature of the substrate to be treated was 350° C. and the pressure inside the vessel 1 was set at 10 MPa, and a barrier film precursor reagent was introduced to the inside of the vessel 1 from the reagent vessel 11 via the reagent adding pump 12 and the reagent adding valve 13. Besides, a reaction reagent was introduced from the gaseous reagent cylinder 18 to the inside of the vessel 1 via the mass flow controller 19 and the check valve 20 then to form a barrier film on the substrate to be treated.

In this example, as pentakis (dimethylamino) tantalum was used as the barrier film precursor reagent and ammonia was used as the reaction reagent thereby to form a tantalum nitride film on the substrate to be treated.

After forming of the barrier film, introduction of the barrier film precursor reagent and ammonia into the vessel 1 was stopped. Then, as in the previous step, pure carbon dioxide was supplied to the vessel 1 while purging was performed to discharge the barrier film precursor reagent, ammonia and a reaction by-product inside the vessel 1 from the back pressure regulator 10 to the outside.

Through this step, the inside of the vessel 1 was filled with the pure carbon dioxide.

Then, the temperature of the substrate to be treated was 200° C. and the pressure inside the vessel 1 was set at 10 MPa, and a wiring film precursor reagent was introduced to the inside of the vessel 1 from the reagent vessel 11 via the reagent adding pump 12 and the reagent adding valve 13. Besides, a reaction reagent was introduced from the gaseous reagent cylinder 18 to the inside of the vessel 1 via the mass flow controller 19 and the check valve 20 then to form a wiring film on the substrate to be treated.

In this example, as hexafloroacetylacetonate copper was used as the barrier film precursor reagent and hydrogen was used as the reaction reagent thereby to further form a copper film on the substrate to be treated on which the barrier film had been formed in the previous step.

After forming of the wiring film, introduction of the wiring film precursor reagent and hydrogen into the vessel 1 was stopped. Then, as in the previous step, pure carbon dioxide was supplied to the vessel 1 while purging was performed to discharge the wiring film precursor reagent, hydrogen and a reaction by-product inside the vessel 1 from the back pressure regulator 10 to the outside.

Through this step, the inside of the vessel 1 was filled with the pure carbon dioxide.

Then, heating of the substrate installation platform 2 was stopped and the vessel 1 was cooled to return the temperature inside the vessel 1 to a normal pressure thereby to obtain a semiconductor silicon substrate.

As described above, the semiconductor silicon substrate could be obtained by continuously performing cleaning, barrier film forming and wiring film forming on the substrate to be treated.

Then, the semiconductor silicon substrate was used to obtain a DRAM semiconductor device, which operated normally and proved excellent reliability.

EXAMPLE 2

FIG. 7 shows a process flow for explaining the manufacturing method of the present invention. The manufacturing method and a manufacturing apparatus of the present invention are described with reference to FIGS. 4 and 7.

First, a substrate to be treated was held on the substrate installation platform 2.

This substrate to be treated is one obtained by subjecting a semiconductor silicon wafer to epitaxial layer forming, isolation forming, well forming, gate insulating film forming, gate electrode forming, spacer forming, and source/drain forming of the aforementioned front-end steps and the substrate has a capacitor hole.

First, the temperature inside the vessel 1 was heated to between 31 to 100° C., inclusive, and carbon dioxide was supplied to the inside of the vessel 1 through the carbon dioxide cylinder 6, the carbon dioxide supplying high-pressure pump 8, and high pressure valves 7 and 9.

Then, as in the case with the example 1, cleaning was performed on the substrate to be treated.

After cleaning, introduction of the cleaning reagent into the vessel 1 was stopped, and as in the case with the example 1, pure carbon dioxide was supplied to the vessel 1 while purging was performed to discharge the cleaning reagent inside the vessel 1 from the back pressure regulator 10 to the outside.

Through this step, the inside of the vessel 1 was filled with the pure carbon dioxide.

Then, the temperature of the substrate to be treated was 350° C. and the pressure inside the vessel 1 was set at 10 MPa, and an electrode film precursor reagent was introduced to the inside of the vessel 1 from the reagent vessel 11 via the reagent adding pump 12 and the reagent adding valve 13. Besides, a reaction reagent was introduced from the gaseous reagent cylinder 18 to the inside of the vessel 1 via the mass flow controller 19 and the check valve 20 then to form an electrode film on the substrate to be treated.

In this example, as tetrakis(N-ethyl-N-methylamino)titanium was used as the electrode film precursor reagent and ammonia was used as the reaction reagent thereby to form a titanium nitride film as a lower electrode on the capacitor hole of the substrate to be treated.

After forming of the electrode film, introduction of the electrode film precursor reagent and ammonia into the vessel 1 was stopped. Then, as in the previous step, pure carbon dioxide was supplied to the vessel 1 while purging was performed to discharge the electrode film precursor reagent, ammonia and a reaction by-product inside the vessel 1 from the back pressure regulator 10 to the outside.

Through this step, the inside of the vessel 1 was filled with the pure carbon dioxide.

Then, the temperature of the substrate to be treated was 300° C. and the pressure inside the vessel 1 was set at 10 MPa, and a capacitor insulating film precursor reagent was introduced to the inside of the vessel 1 from the reagent vessel 11 via the reagent adding pump 12 and the reagent adding valve 13. Besides, a reaction reagent was introduced from the gaseous reagent cylinder 18 to the inside of the vessel 1 via the mass flow controller 19 and the check valve 20 then to further form a capacitor insulating film on the substrate to be treated on which the electrode film had been formed.

In this example, as tetrakis(N-ethyl-N-methylamino) hafnium was used as the capacitor insulating film precursor reagent and oxygen was used as the reaction reagent thereby to further form a hafnium oxide film on the substrate to be treated on which the lower electrode layer had been formed in the previous step.

After forming of the capacitor insulating film, introduction of the capacitor insulating film precursor reagent and oxygen into the vessel 1 was stopped. Then, as in the previous step, pure carbon dioxide was supplied to the vessel 1 while purging was performed to discharge the capacitor insulating film precursor reagent, oxygen and a reaction by-product inside the vessel 1 from the back pressure regulator 10 to the outside.

Through this step, the inside of the vessel 1 was filled with the pure carbon dioxide.

Then, the temperature of the substrate to be treated was 350° C. and the pressure inside the vessel 1 was set at 10 MPa, and an electrode film precursor reagent was introduced to the inside of the vessel 1 from the reagent vessel 11 via the reagent adding pump 12 and the reagent adding valve 13. Besides, a reaction reagent was introduced from the gaseous reagent cylinder 18 to the inside of the vessel 1 via the mass flow controller 19 and the check valve 20 then to form an electrode film on the substrate to be treated on which the electrode film and the capacitor insulating film had been formed.

In this example, as tetrakis(N-ethyl-N-methylamino)titanium was used as the barrier film precursor reagent and ammonia was used as the reaction reagent thereby to form a titanium nitride film as a upper electrode on the substrate to be treated.

After forming of the upper electrode film, introduction of the electrode film precursor reagent and ammonia into the vessel 1 was stopped. Then, as in the previous step, pure carbon dioxide was supplied to the vessel 1 while purging was performed to discharge the electrode film precursor reagent, ammonia and a reaction by-product inside the vessel 1 from the back pressure regulator 10 to the outside.

Through this step, the inside of the vessel 1 was filled with the pure carbon dioxide.

Then, heating of the substrate installation platform 2 was stopped and the vessel 1 was cooled to return the temperature inside the vessel 1 to a normal pressure thereby to obtain a semiconductor silicon substrate.

As described above, the semiconductor silicon substrate could be obtained by continuously performing cleaning, electrode film forming, capacitor insulating film forming and electrode film forming on the substrate to be treated.

Then, the semiconductor silicon substrate was used to obtain a DRAM semiconductor device, which operated normally and proved excellent reliability.

EXAMPLE 3

In place of the substrate to be treated used in the example 2, a substrate to treated used in this example is one obtained by, as illustrated in FIG. 8, preparing a substrate having a glass film 28 of boron phosphorous silicate glass and an oxide film 29 of oxide silicon on the surface and performing dry etching on the substrate to form a capacitor hole 30.

As illustrated in FIG. 8, the capacitor hole 30 becomes smaller in diameter toward the inside of the substrate to be treated.

Figure 9:
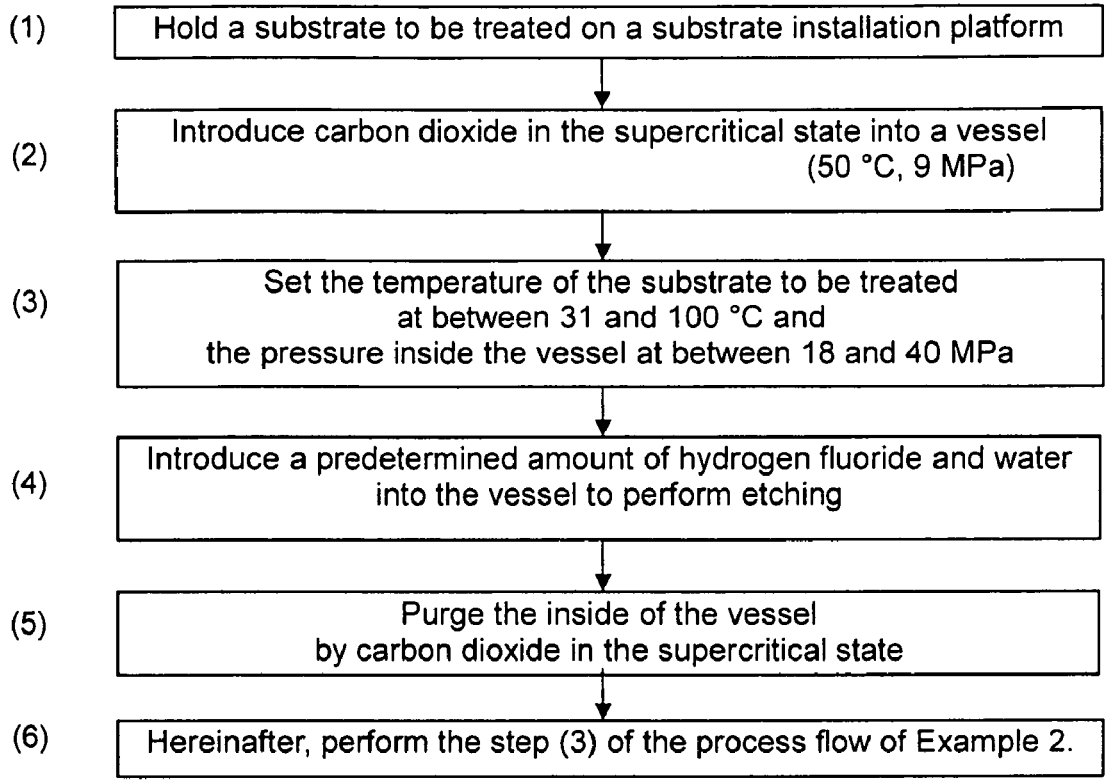
FIG. 9 is a process flow for explaining a manufacturing method of the example 3.

As illustrated in FIG. 9, first, the temperature inside the vessel 1 was heated to be between 31 to 100° C., inclusive, and carbon dioxide was supplied to the inside of the vessel 1 through the carbon dioxide cylinder 6, the carbon dioxide supplying high-pressure pump 8, and high pressure valves 7 and 9 so that the pressure inside the vessel was controlled to be between 18 to 40 MPa, inclusive.

This was following by performing etching on the substrate to be treated in the presence of hydrofluoric acid.

In this etching step, a difference between the etching speed of the boron phosphorous silicate glass and the etching speed of the oxide silicon could be utilized to correct the shape of the capacitor hole 30.

Then, the same steps as those in the example 2 were performed on the substrate to be treated thereby to obtain a semiconductor silicon substrate.

EXAMPLE 4

In place of the substrate to be treated used in the example 2, a substrate to treated used in this example is one obtained by, as illustrated in FIG. 10, preparing a substrate having a glass film 28 of oxide silicon and a resist film on the surface and performing dry etching on the substrate to form a capacitor hole 30.

As illustrated in FIG. 10, a deposit component 31 of dry etching is attached to the capacitor hole 30.

Figure 11:
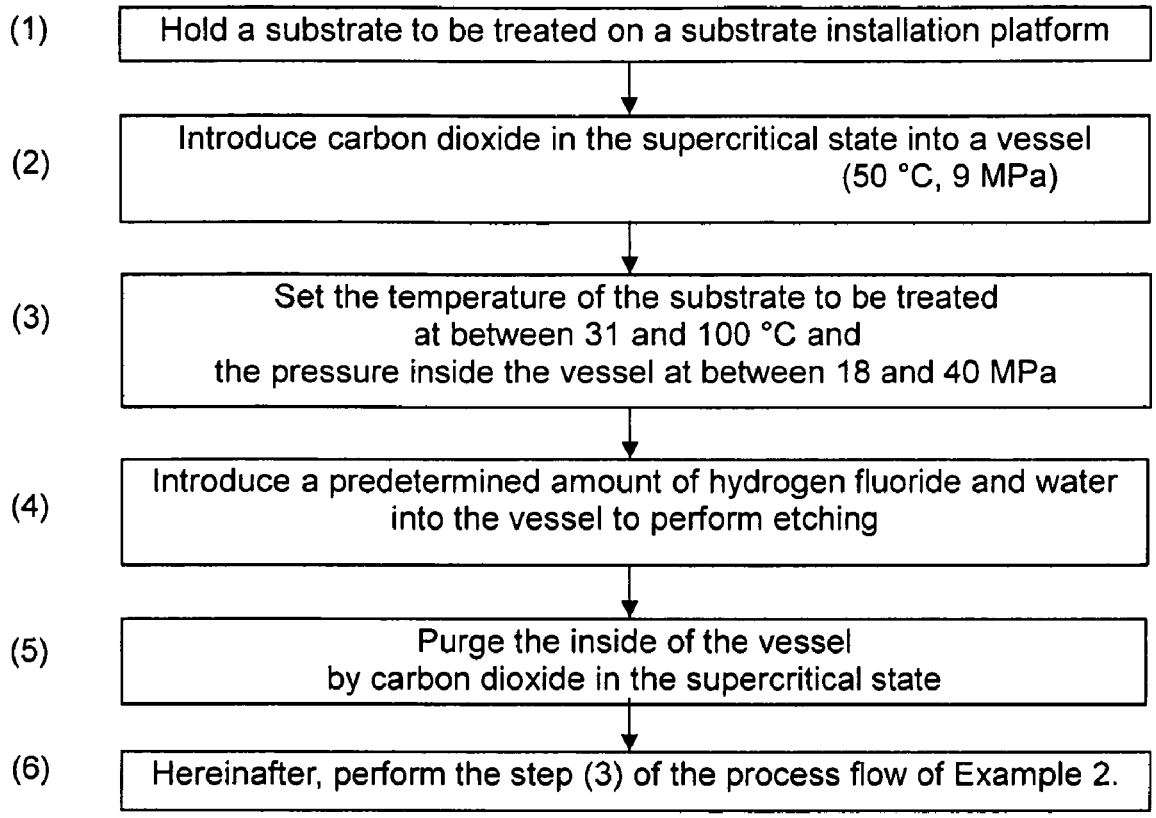
FIG. 11 is a process flow for explaining a manufacturing method of the example 4.

As illustrated in FIG. 11, first, the temperature inside the vessel 1 was heated to be between 31 to 100° C., inclusive, and carbon dioxide was supplied to the inside of the vessel 1 through the carbon dioxide cylinder 6, the carbon dioxide supplying high-pressure pump 8, and high pressure valves 7 and 9 so that the pressure inside the vessel was controlled to be between 18 to 40 MPa, inclusive. This was following by removing a resist on the substrate to be treated in the presence of a resist removing reagent such as alcohols.

After removing of the resist, introduction of the resist removing reagent into the vessel 1 was stopped. Then, as in the previous step, pure carbon dioxide was supplied to the vessel 1 while purging was performed to discharge the resist removing reagent and a resist removal component inside the vessel 1 from the back pressure regulator 10 to the outside.

Through this step, the inside of the vessel 1 was filled with the pure carbon dioxide.

Then, etching was performed on the substrate to be treated in the presence of hydrofluoric acid.

With this etching step, the deposit component 31 of the capacitor hole 30 could be removed.

Then, the same steps as those in the example 2 were performed on the substrate to be treated thereby to obtain a semiconductor silicon substrate.

The present invention is not limited to the above described embodiments, and various variations and modifications may be possible without departing from the scope of the present invention.

This application is based on the Japanese Patent application No. 2005-340753 filed on Nov. 25, 2005, entire content of which is expressly incorporated by reference herein.

What is claimed is:

1. A method for manufacturing a semiconductor silicon substrate comprising:
    a film forming step of forming an electrically conductive film, an insulating film and barrier film on a substrate in the presence of carbon dioxide in the supercritical state under conditions of a temperature of from 150 to 350° C. and a pressure of from 7.5 to 12 MPa; and at least one of:
    a cleaning step of cleaning the substrate in a presence of carbon dioxide in a supercritical state under conditions of a temperature of from 31 to 100° C. and a pressure of from 18 to 40 MPa;
    an etching step of etching the substrate in the presence of carbon dioxide in the supercritical state under conditions of a temperature of from 31 to 100° C. and a pressure of from 18 to 40 MPa; and
    a resist removing step of removing a resist on the substrate in the presence of carbon dioxide in the supercritical state under conditions of a temperature of from 31 to 80° C. and a pressure of from 18 to 40 MPa.

2. The method of claim 1, wherein the film forming step comprises:
    a first step of forming a barrier film on the substrate in the presence of carbon dioxide in the supercritical state under conditions of a temperature of from 200 to 350° C. and a pressure of from 7.5 to 12 MPa; and
    a second step of forming the electrically conductive film on the substrate Be treated in the presence of carbon dioxide in the supercritical state under conditions of a temperature of from 150 to 300° C. and a pressure of from 7.5 to 12 MPa.

3. The method of claim 1, wherein the film forming step comprises:
    a first step of forming the electrically conductive film on the substrate in the presence of carbon dioxide in the supercritical state under conditions of a temperature of from 200 to 350° C. and a pressure of from 7.5 to 12 MPa;
    a second step of forming an insulating film in contact with the electrically conductive film on the substrate in the presence of carbon dioxide in the supercritical state under conditions of a temperature of from 150 to 350° C. and a pressure of from 7.5 to 12 MPa; and
    a third step of forming another electrically conductive film in contact with the insulating film on the substrate in the presence of carbon dioxide in the supercritical state under conditions of a temperature of from 200 to 350° C. and a pressure of from 7.5 to 12 MPa.

4. The method of claim 1, wherein the steps are performed with inside one vessel.

5. The method of claim 2, wherein the steps are performed inside one vessel.

6. The method of claim 3, wherein the steps are performed inside one vessel.

7. A semiconductor device including a semiconductor silicon substrate obtained by the method of claim 1.

8. A semiconductor device including a semiconductor silicon substrate obtained by the method of claim 2.

9. A semiconductor device including a semiconductor silicon substrate obtained by the method of claim 3.

10. A semiconductor device including a semiconductor silicon substrate obtained by the method of claim 4.

11. A semiconductor device including a semiconductor silicon substrate obtained by the method of claim 5.

12. A semiconductor device including a semiconductor silicon substrate obtained by the method of claim 6.

* * * * *